United States Patent [19]

Bowles

[11] Patent Number: 4,841,165

[45] Date of Patent: Jun. 20, 1989

[54] D. C. POWER CONTROLLER

[75] Inventor: Gary L. Bowles, Long Beach, Calif.

[73] Assignee: Wesley H. Heinmiller, Wilimington, Calif.

[21] Appl. No.: 155,594

[22] Filed: Feb. 12, 1988

[51] Int. Cl.$^4$ .............................................. H02J 1/02
[52] U.S. Cl. ................................ 307/132 R; 307/141;
318/599; 323/351; 388/829; 388/831; 388/915
[58] Field of Search ............... 307/115, 116, 117, 132,
307/141, 141.4, 141.8; 318/139, 282, 283, 287,
293, 301, 314, 317, 326, 327, 329, 341, 345 R,
345 B, 599; 363/41, 20, 21, 39, 40, 124, 128;
323/288, 271, 272, 351, 323, 326

[56] References Cited

U.S. PATENT DOCUMENTS

| | | | |
|---|---|---|---|
| 3,875,486 | 4/1975 | Barton | 318/341 |
| 4,155,069 | 5/1979 | Mason | 340/81 R |
| 4,217,526 | 8/1980 | Farr | 318/341 X |
| 4,441,068 | 4/1984 | Smith | 318/139 X |
| 4,599,555 | 7/1986 | Damiano et al. | 323/351 |
| 4,673,851 | 6/1987 | Disser | 318/599 X |

OTHER PUBLICATIONS

Engineer's Mini-Notebook: 555 Timer IC Circuits, Forrest M. Mims III, p. 27.

Primary Examiner—William M. Shoop, Jr.
Assistant Examiner—Paul Ip
Attorney, Agent, or Firm—Fulwider, Patton, Lee & Utecht

[57] ABSTRACT

A DC power controller for controlling the rate at which direct current is furnished to a load. A signal generator provides a periodic signal having a first value during a first portion of each period and a second value during a second portion of the period. A switch such as a power MOSFET enables direct current from the source to flow through the load during the time the signal has one of said values and prevents the current from flowing during the time the signal has the other value. A control is manually operable to vary the relative durations of the first and second portions of each period and thereby control the rate at which electric power is furnished to the load. A plurality of MOSFETS may be arranged in parallel if the load draws more current than one MOSFET can safely switch. Surge and back EMF protection are provided for inductive or variable resistance loads.

11 Claims, 1 Drawing Sheet

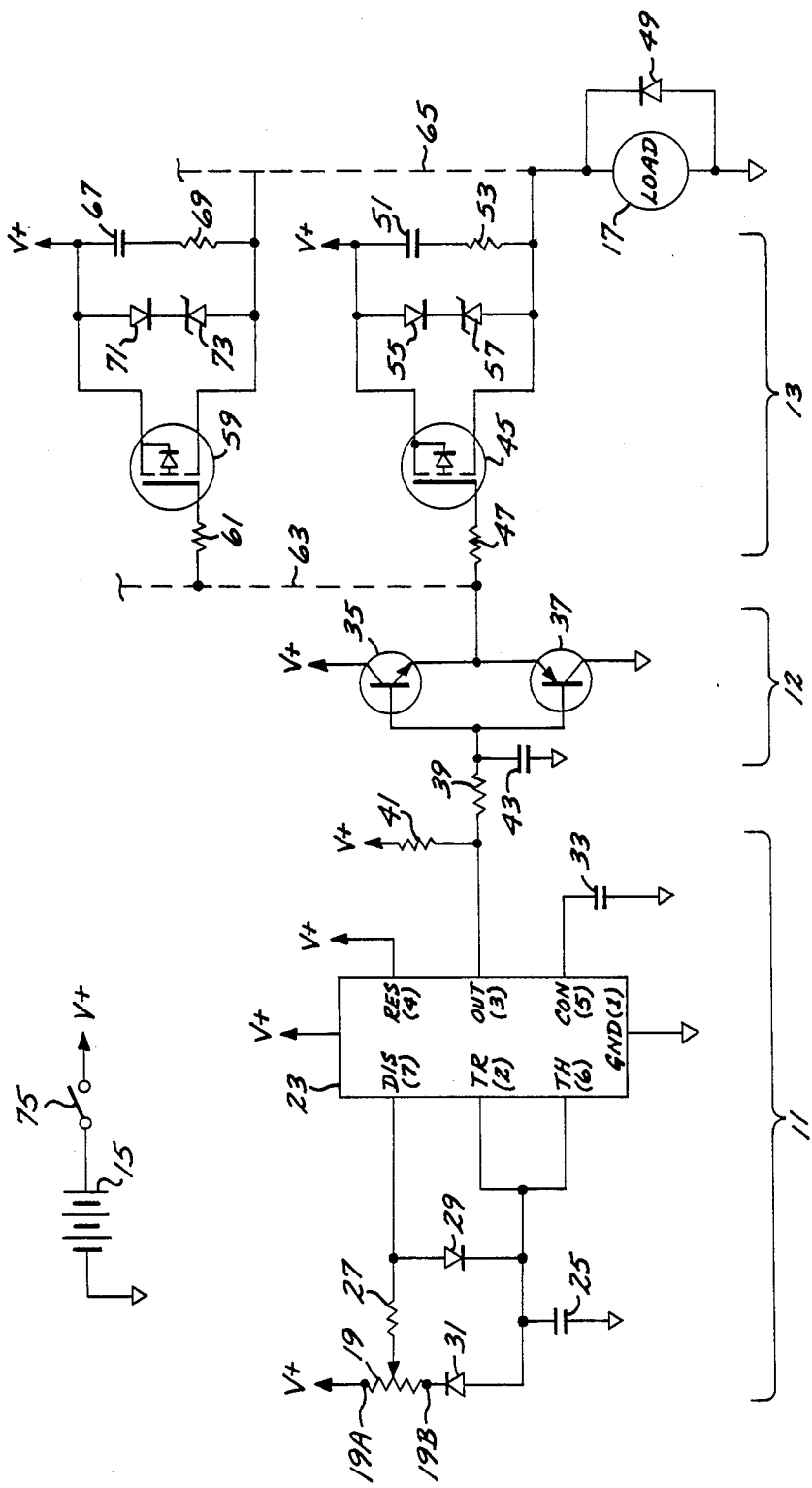

D. C. POWER CONTROLLER

BACKGROUND OF THE INVENTION

The present invention relates generally to means for controlling electric power, and more particularly to apparatus for manually controlling the rate at which electric power is furnished to a load from a source of direct current.

It is frequently desirable to manually control the rate at which electric power is furnished to a load. For example, the speed of an electric motor or the brightness of an electric lamp can be varied by controlling the flow of electric power into the device. Electric power can be controlled by means of a rheostat connected in series with the load to control the flow of electric current therethrough, but rheostats are physically bulky, they waste electricity, and they tend to dissipate large amounts of heat, especially in high power applications. If alternating current ("AC"), such as ordinary household power, is available, then the disadvantages of rheostats can be avoided by employing a solid state device such as a silicon controlled rectifier rather than a rheostat to control the flow of current through the load. However, if AC power is not available, then direct current ("DC") from a battery or the like must be used, and solid state devices have not been readily adaptable to the control of DC power.

It has been proposed ("Engineer's Mini-Notebook: 555 Timer IC Circuits" at page 27, by Forrest M. Mims III, published by Radio Shack) to vary the apparent brightness of a DC-powered lamp by applying a variable-frequency square wave to the lamp. However, as the frequency is reduced a flicker may become visible, and such a flicker may not be acceptable. Moreover, this proposal does not address the problems of controlling DC power for other loads such as motors or other inductive devices. Accordingly there remains a need for a compact and efficient means to control the rate at which DC power is furnished to a load.

SUMMARY OF THE INVENTION

The present invention provides a DC power controller which is physically compact and which consumes very little electric power and dissipates but a small amount of heat. The rate at which DC power is furnished to a load such as a lamp or a motor from a battery or the like can be continuously varied from full on to full off, and at reduced power levels the draw of current from the battery is reduced, thereby prolonging the life of the battery.

Briefly and in general terms, apparatus according to the invention controls the rate at which electric power is furnished to a load from a source of direct current. A signal generator provides a periodic signal having a first value during a first portion of each period and a second value during a second portion of the period. A switch is responsive to the signal to enable direct current from the source to flow through the load during the time the signal has one of its values and to prevent the current from flowing during the time the signal has the other value. A control is manually operable to vary the relative durations of the first and second portions of each period and thereby control the rate at which electric power is furnished to the load.

An amplifier, for example an NPN transistor and a PNP transistor in a push-pull configuration, receives the signal from the signal generator, amplifies the signal, and applies the amplified signal to the switch if the signal as provided by the signal generator is not strong enough to operate the switch directly.

In one embodiment a power MOSFET serves as the switch. A plurality of MOSFETs or other switch elements in a parallel configuration are employed if the load current is too great for a single element to control. Current surge limiting means in parallel relationship with the switching elements protect against current surges. Means such as diodes protect the switch means from any back EMF developed across a load such as a motor.

In a preferred embodiment the signal generator includes a timing capacitor and circuit means operative to alternately charge the capacitor at a first rate and discharge it at a second rate. The duration of the first portion of each period is determined by the first rate and the duration of the second portion of each period is determined by the second rate. The control comprises a potentiometer and the circuit means comprises a first diode which establishes a charging circuit for the capacitor through a first portion of the potentiometer and a second diode which establishes a discharging circuit for the capacitor through a second portion of the potentiometer. Changing the setting of the potentiometer increases the duration of one portion of the period and correspondingly decreases the duration of the other portion but does not significantly affect the duration of the period as a whole.

Other aspects and advantages of the invention will become apparent from the following detailed description taken in conjunction with the accompanying drawing which illustrates by way of example the principles of the invention.

BRIEF DESCRIPTION OF THE DRAWING

The FIGURE is a schematic of a preferred embodiment of a DC power controller according to the present invention.

DESCRIPTION OF THE PREFERRED EMBODIMENT

As shown in the FIGURE for purposes of illustration, the invention is embodied in a novel DC power controller. The rate at which electrical power is furnished to a load such as an electric lamp or an electric motor has been controlled by rheostats or by solid state devices such as silicon controlled rectifiers, but rheostats are bulky and inefficient and dissipate much heat, and solid state devices have not been conveniently adaptable to the control of direct current.

In accordance with the invention, a signal generator provides a periodic signal having a first value during a first portion of each period and a second value during a second portion of the period. Switch means enables direct current to flow through a load during the time the signal has one of said values and to prevent the current from flowing during the time the signal has the other value. A manually operable control varies the relative durations of the first and second portions of each period and thereby controls the rate at which electric power is furnished to the load. A power controller according to the invention is physically compact, dissipates but little heat, and conserves power.

In a preferred embodiment of the invention, a signal generator designated generally as 11 is operative to provide a periodic signal having a first value during a first portion of each period and a second value during a second portion of the period, as shown schematically in the FIGURE. Switch means, designated generally as 13, is responsive to the signal to enable direct current from a power source such as a battery 15 to flow through a load 17 during the time the signal has one of said values and to prevent the current from flowing during the time the signal has the other value Control means such as a potentiometer 19 is manually operable to vary the relative durations of the first and second portions of each period and thereby control the rate at which electric power is furnished to the load 17.

An amplifier designated generally as 21 is provided to receive the signal from the signal generator 11, amplify the signal, and apply the amplified signal to the switch means 13.

The signal generator 11 includes a type 555 timer chip 23 having trigger ("TR") and threshold ("TH") terminals (pins 2 and 6, respectively) connected together and to a first terminal of a timing capacitor 25. A second terminal of the capacitor 25 is connected to ground. A discharge ("DIS") terminal (pin 7) of the chip 23 is connected to a wiper terminal of the potentiometer 19 through a resistor 27. A first fixed terminal 19A of the potentiometer 19 is connected to a positive power supply connection designated as "V+". A ground ("GND") terminal (pin 1) of the chip 23 is connected to ground.

Circuit means operative to alternately charge the capacitor 25 at a first rate and discharge it at a second rate includes a first diode 29 having a cathode connected to the first terminal of the capacitor 25 and an anode connected to the DIS terminal of the chip 23, and a second diode 31 having an anode connected to the first terminal of the capacitor 25 and a cathode connected to a second fixed terminal 19B of the potentiometer 19. The duration of the first portion of each period is determined by the first rate and the duration of the second portion of each period is determined by the second rate.

The first diode 29 establishes a charging circuit for the capacitor 25 which extends from V+ to the first terminal of the capacitor 25 through a first portion of the potentiometer 19 which extends between the first fixed terminal 19A thereof and the wiper terminal, through the resistor 27, and through the diode 29. This charging circuit is active when the diode 29 is forward biased, as explained in more detail in a succeeding paragraph.

The second diode 31 establishes a discharging circuit for the capacitor 25 which extends from the first terminal of the capacitor 25 to ground through the diode 31, through a second portion of the potentiometer 19 which extends between the second fixed terminal 19B thereof and the wiper terminal, through the resistor 27, and through the chip 23 between the DIS and GND terminals thereof. This discharging circuit is active when the diode 31 is forward biased, as explained in more detail in a succeeding paragraph.

A control voltage ("CON") terminal (pin 5) of the chip 23 is connected to ground through a stabilizing capacitor 33. A power input ("Vcc") terminal (pin 8) of the chip 23 is connected to V+ to provide power to the chip 23, and a reset ("RES") terminal (pin 4) of the chip 23, which is not used in the circuit of the invention, is also connected to V+.

The amplifier 21 includes an NPN transistor 35 and a PNP transistor 37 in a push-pull configuration. Bases of both transistors are connected to an output ("OUT") terminal (pin 3) of the chip 23 through a resistor 39. A bias resistor 41 is connected between the OUT terminal and V+. A stabilizing capacitor 43 is connected from the bases of the transistors 35 and 37 to ground. A collector of the transistor 35 is connected to V+ and a collector of the transistor 37 is connected to ground, and emitters of the transistors 35 and 37 are connected together.

The switch means 13 comprises a power MOSFET 45 having a gate connected to the emitters of the transistors 35 and 37 through a resistor 47. The MOSFET 45 has a source terminal which is connected to V+ and a drain terminal which is connected to a first terminal of the load 17. A second terminal of the load 17 is connected to ground. An arc-suppressing diode 49 is connected across the load 17, an anode of the diode 49 being connected to ground and a cathode thereof being connected to the drain of the MOSFET 45.

Current surge limiting means includes a capacitor 51 connected between the source of the MOSFET 45 and a first terminal of a resistor 53. A second terminal of the resistor 53 is connected to the drain of the MOSFET 45.

An anode of a diode 55 is also connected to the source of the MOSFET 45. A cathode of the diode 55 is connected to a cathode of a Zener diode 57. An anode of the Zener diode 57 is connected to the drain of the MOSFET 45. The diode 55 and the Zener diode 57 together provide a bypass around the MOSFET 45 for any back EMF which might be developed across an inductive load such as an electric motor.

If the load 17 requires more current than can safely be controlled by a single switching element, one or more additional switching elements may be connected in parallel with the first. As indicated by broken lines in the FIGURE, a gate of a second MOSFET 59 is connected to the emitters of the transistors 35 and 37 through a resistor 61 as indicated by a broken line 63, a source of the MOSFET 59 is connected to V+, and a drain thereof is connected to the load 17 as indicated by a broken line 65, thereby effectively placing the second MOSFET 59 in parallel with the first MOSFET 45. It will be apparent that additional switching elements can be added as necessary to control any desired level of current.

A current surge limiting capacitor 67 is connected between the source of the MOSFET 59 and a first terminal of a resistor 69. A second terminal of the resistor 69 is connected to the drain of the MOSFET 59. These components 67 and 69 protect against a surge of current through a variable resistance load such as a lamp which has a low internal resistance when cold.

An anode of a diode 71 is also connected to the source of the MOSFET 59, a cathode of the diode 71 is connected to a cathode of a Zener diode 73, and an anode of the Zener diode 73 is connected to the drain of the MOSFET 59 to protect the MOSFET 59 against any back EMF developed across an inductive load such as an electric motor.

Electrical power is provided by a direct current power supply such as the battery 15 which has a negative terminal connected to ground and a positive terminal connected to V+ through a power switch 75. If desired, a separate power supply (not shown) can be provided for the load by connecting a positive terminal of such a separate power supply to the source of the MOSFETs 45 and 59 and the negative terminal thereof to ground.

The operation of the circuit will now be described. When power is first applied, logic devices contained in the chip 23 cause the DIS terminal to be open-circuited and the OUT terminal to be at a HI level. When the DIS terminal is open-circuited, the diode 29 is forward biased and the diode 31 is reverse biased, thereby enabling the previously-described charging circuit through the first portion of the potentiometer 19 and disabling the discharging circuit. Accordingly, current flows from the power supply into the timing capacitor 25 through the first portion of the potentiometer 19, the resistor 27, and the diode 29, causing the capacitor 29 to charge at the first rate.

When the voltage across the capacitor 25 as sensed by the TH terminal of the chip 23 reaches about ⅔ of the V+ power supply voltage, the OUT terminal of the chip 23 goes to a LO level and the DIS terminal is grounded. When the DIS terminal is grounded, the diode 29 is reverse biased and the diode 31 is forward biased, thereby enabling the discharging circuit through the second portion of the potentiometer 19 and disabling the charging circuit. Accordingly, the capacitor 25 begins to discharge at the second rate through the diode 31, the second portion of the potentiometer 19, the resistor 27, and the chip 23. When the voltage across the capacitor 25 as sensed by the TR terminal of the chip 23 reaches about ⅓ of the V+ power supply voltage, the OUT terminal returns to the HI level, the DIS terminal is again open-circuited within the chip 23, the capacitor 25 begins to charge again, and the entire process is repeated.

The smaller the resistance in series with the capacitor 25, the faster the corresponding charge or discharge rate will be. Thus, if the wiper of the potentiometer is moved toward the first terminal 19A, the resistance of the first portion of the potentiometer, and hence the resistance in the charging circuit, is reduced and the resistance in the discharging circuit is increased; this ha the effect of speeding up the first (charging) rate, thereby shortening the first portion of the period, and slowing down the second (discharging) rate thereby lengthening the second portion of period. Conversely, if the wiper of the potentiometer is moved toward the second terminal 19B, the resistance in the charging circuit is increased and that in the discharging circuit is reduced, lengthening the first portion of the period and shortening the second portion of the period.

The duration of each period is determined by the sum of the charging and discharging times. The charging time is the time required for the capacitor to charge to a voltage equal to the threshold level of the chip 23 (about ⅔ of V+) and the discharging time is the time required for the capacitor to discharge to a voltage equal to the trigger level of the chip 23 (about ⅓ of V+). This sum is determined by the values of the potentiometer 19, the resistor 27, and the capacitor 25. A period of about 0.003 to 0.0001 seconds (corresponding with a frequency of about 3 to 10 KHz) gives satisfactory circuit operation and can be achieved with a 1 megohm potentiometer, a 1000 ohm resistor, and a 0.01 mfd capacitor. Type 1N4003 diodes can be used for the diodes 29 and 31.

If the wiper of the potentiometer 19 is moved toward the first fixed terminal 19A, the charging rate is increased and the time required for the capacitor to charge is correspondingly shortened, and the discharging rate is reduced and the time required for the capacitor to discharge is correspondingly lengthened; however, the sum of these times tends to remain constant and hence the duration of the period does not change significantly. Conversely, if the wiper is moved toward the second terminal 19B, the charging time is lengthened and the discharge time is shortened but the duration of the period is not significantly changed.

From the above discussion it will be apparent that the OUT terminal of the chip 23 will be HI during the time the capacitor 25 is charging and will be LO during the time the capacitor is discharging. Thus, if the potentiometer 19 is set such that the charge time is relatively long and the discharge time relatively short, the OUT terminal will be HI during most of each period. Conversely, if the potentiometer 19 is set such that the charge time is relatively short and the discharge time relatively long, the OUT terminal will be LO during most of each period.

When the OUT terminal is HI, transistor 37 is off and transistor 35 is on, enabling current to flow from V+ to the bases of the MOSFETs 45 and 59. This in turn enables power to flow through the MOSFETs 45 and 59 from V+ to the load 17. Conversely, when the OUT terminal is LO, transistor 35 is off and transistor 37 is on, effectively grounding the bases of the MOSFETs 45 and 59 and preventing power from flowing to the load 17.

Accordingly, as the wiper of the potentiometer 19 is set closer to the first terminal 19A, the OUT terminal of the chip 23 is HI for a shorter portion of each period and current flows through the load 17 for a shorter portion of each period. As the wiper is moved toward the second terminal 19B, the OUT terminal is HI for a longer portion of each period and current flows through the load 17 for a longer portion of each period. Thus, as the wiper is moved closer to the first terminal 19A, the load 17 receives power at a lesser rate, and as the wiper is moved closer to the second terminal 19B, the load 17 receives power at a greater rate.

The stabilizing capacitors 33 and 43 serve to protect against interference and unwanted oscillation. Good results are obtained by means of 0.001 mfd and 0.1 mfd capacitors, respectively. The resistors 39 and 41 can be 3300 ohms and 10,000 ohms, respectively.

The transistors 35 and 37 are switching transistors and should be selected according to the current input required to operate the switching means 17. Types 2N5320 and 2N5322, respectively, can be used in the circuit shown.

The MOSFETs 45 and 59 are P-FETs selected according to the maximum current required to operate the load.

For typical P-FETs, satisfactory results are obtained by using 15 ohm resistors for the resistors 47 and 61, 50 ohm resistors for the resistors 53 and 69, and 0.1 mfd capacitors for the capacitors 51 and 67. The diodes 55 and 71 can be type 1N4003 and the Zener diodes 57 and 73 can be type 1N4756A. The arc-suppressing diode is selected according to the load and could be, for example, a type 30DL1.

From the foregoing it will be appreciated that the rate at which direct current power is furnished to a load can be manually varied over a wide range by means of a DC power controller according to the invention. The circuitry is amenable to miniaturization, thereby providing a physically compact power controller. Surge protection and back EMF protection are included to permit use of the controller with inductive loads as well as with resistive loads. Little power is dissipated as heat, and at lower power levels the amount of power drawn from the power source is reduced, thereby prolonging the life of a limited power source such as a battery.

Although a specific embodiment of the invention has been described and illustrated, the invention is not to be limited to the specific forms or arrangements of parts so described and illustrated, and various modifications and changes can be made without departing from the scope and spirit of the invention. Within the scope of the appended claims, therefore, the invention may be practiced otherwise than as specifically described and illustrated.

I claim:

1. Apparatus for controlling the rate at which electric power is furnished to a load from a source of direct current, the apparatus comprising:
   a signal generator operative to provide a periodic signal having a first value during a first portion of each period and a second value during a second portion of the period, the signal generator comprising a timing capacitor and circuit means operative to alternately charge the capacitor at a first rate and discharge the capacitor at a second rate, the duration of the first portion of each period being determined by the first and the duration of the second portion of each period being determined by the second rate,
   switch means responsive to the signal to enable direct current from the source to flow through the load during the time the signal has one of said values and to prevent the current from flowing during the time the signal has the other value; and
   control means manually operable to vary the relative durations of the first and second portions of each period and thereby control the rate at which electric power is furnished to the load.

2. Apparatus according to claim 1 wherein the control means comprises a potentiometer and the circuit means comprises a first diode operative to establish a charging circuit for the capacitor through a first portion of the potentiometer and a second diode operative to establish a discharging circuit for the capacitor through a second portion of the potentiometer.

3. Apparatus according to claim 1 wherein the switch means comprises a plurality of switch elements in a parallel configuration.

4. Apparatus according to claim 3 wherein the switch elements comprise power MOSFETs.

5. Apparatus according to claim 4 and further comprising current surge limiting means in parallel relationship with the MOSFETs.

6. Apparatus according to claim 1 and further comprising means to protect the switch means from any back EMF developed across the load.

7. Apparatus according to claim 1 wherein the duration of the period is not significantly affected by the control means.

8. Apparatus for controlling the rate at which electric power is furnished to a load from a source of direct current, the apparatus comprising:
   a signal generator operative to provide a periodic signal having a first value during a first portion of each period and a second value during a second portion of the period, the signal generator including a timing capacitor, a potentiometer, and circuit means including a first diode operative to establish a charging circuit for the capacitor through a first portion of the potentiometer and a second diode operative to establish a discharging circuit for the capacitor through a second portion of the potentiometer, the circuit means being operative to alternately charge the capacitor at a first rate and discharge the capacitor at a second rate, the duration of the first portion of each period being determined by the first rate and the duration of the second portion of each period being determined by the second rate;
   an amplifier including an NPN transistor and a PNP transistor in a push-pull configuration, operative to receive the signal from the signal generator and amplify the signal; and
   switch means including current surge limiting means, responsive to the amplified signal to enable direct current from the source to flow through the load during the time the signal has one of its values and to prevent the current from flowing during the time the signal has the other of its values;
   the potentiometer being manually operable to vary the relative durations of the first and second portions of each period and thereby to control the rate at which electric power is furnished to the load.

9. Apparatus according to claim 8 wherein the switch means comprises a plurality of power MOSFETs in a parallel configuration.

10. Apparatus according to claim 8 and further comprising means to protect the switch means from any back EMF developed across the load.

11. Apparatus according to claim 8 wherein the duration of the period is not significantly affected by the potentiometer.

* * * * *